United States Patent [19]

Grabbe

[11] Patent Number: 5,116,458
[45] Date of Patent: May 26, 1992

[54] ELECTRICAL EDGE CONTACT MEMBER AND A METHOD OF MANUFACTURING SAME

[75] Inventor: Dimitry G. Grabbe, Middletown, Pa.

[73] Assignee: AMP Incorporated, Harrisburg, Pa.

[21] Appl. No.: 762,693

[22] Filed: Sep. 19, 1991

Related U.S. Application Data

[62] Division of Ser. No. 467,720, Jan. 19, 1990.

[51] Int. Cl.$^5$ .............................. C23F 1/02; B44C 1/22
[52] U.S. Cl. ..................................... 156/630; 156/634; 156/645; 156/656; 156/664
[58] Field of Search ............... 156/630, 634, 645, 640, 156/656, 659.1, 664, 901, 902, 250, 268; 439/71, 72, 73; 29/874, 876, 877

[56] References Cited

U.S. PATENT DOCUMENTS

| | | | |
|---|---|---|---|
| 3,956,814 | 5/1976 | Peet | 156/645 X |
| 4,236,777 | 12/1980 | Merlina et al. | 156/630 X |
| 4,404,059 | 9/1983 | Livshits et al. | 156/656 X |

*Primary Examiner*—William A. Powell
*Attorney, Agent, or Firm*—Allan B. Osborne

[57] ABSTRACT

An electrical edge contact member for use in an integrated circuit chip burn-in connector is formed as a laminate of at least one layer of a first material having good spring properties and at least one layer of a second material which does not form a solid solution with the surface material of the integrated circuit chip lead. Along the edge of the contact member where it contacts the chip lead the layers of the first material are recessed with respect to the layers of the second material, so that only the second material contacts the integrated circuit chip lead.

6 Claims, 1 Drawing Sheet

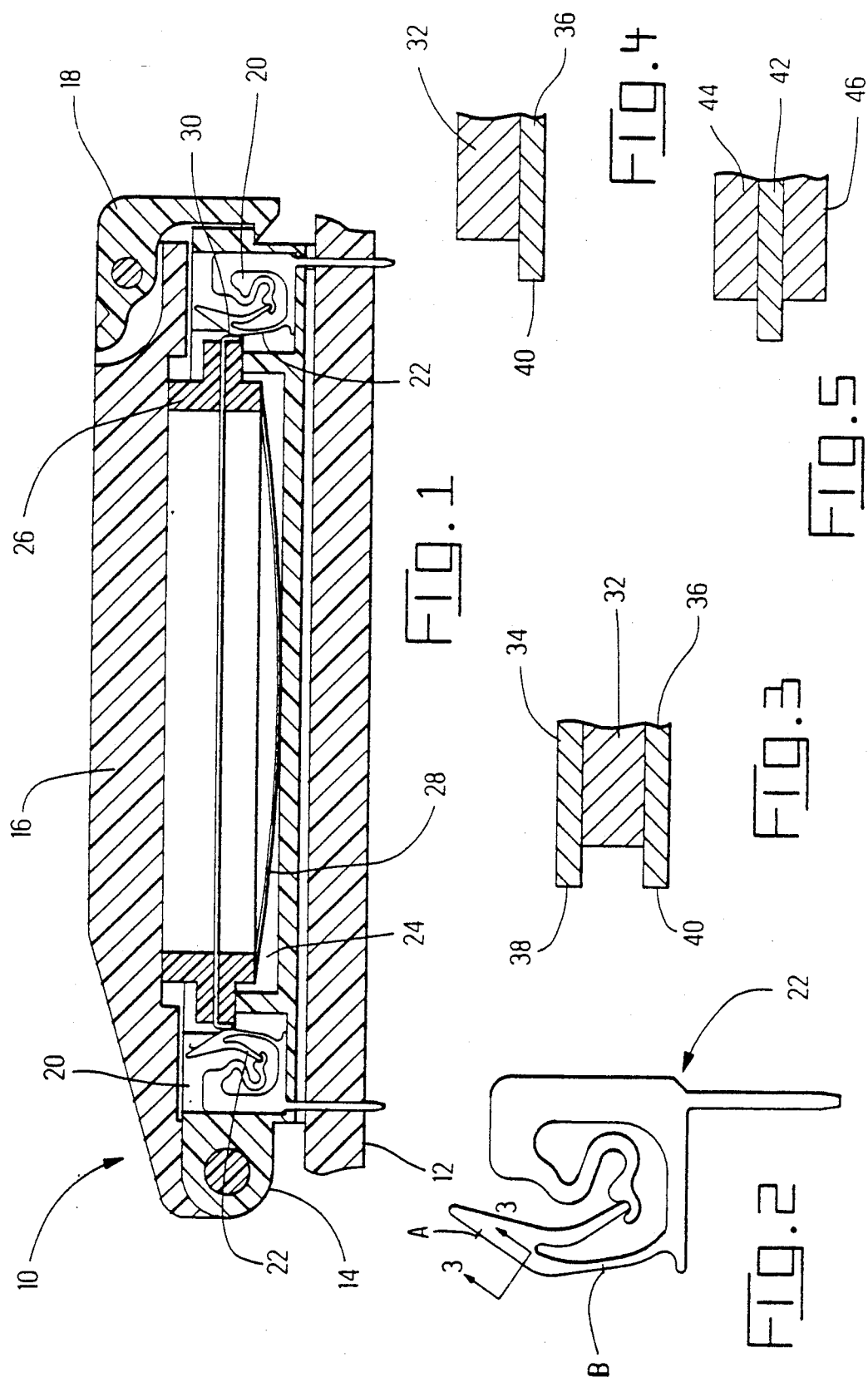

ELECTRICAL EDGE CONTACT MEMBER AND A METHOD OF MANUFACTURING SAME

This application is a divisional of application Ser. No. 07/467,720 filed Jan. 19, 1990.

BACKGROUND OF THE INVENTION

This invention relates to electrical contact members and, more particularly, to an improved edge contact member for use in an integrated circuit chip burn-in connector.

As part of the manufacturing process, integrated circuit chips typically go through a process of burn-in testing. To accomplish this testing, a special burn-in connector is utilized. This connector typically undergoes a large number of insertion/removal cycles of integrated circuit chips. Accordingly, the connector structure and the contact members in particular have to be designed to accommodate the large number of cycles.

Integrated circuit chips are typically manufactured with tin plated leads. This results in a contact physics or metallurgy problem. It is known that when two dissimilar metals come into rubbing contact, a thin layer of the softer metal will be deposited on the harder metal. Therefore, if the connector contact is gold plated, at the first insertion of an integrated circuit chip, a small amount of tin from the chip leads will be transferred as an extremely thin layer onto the gold of the connector contacts. By its very nature, a thin layer of this type is very stressed. The tin will then attempt to reduce its stress state by reacting with an available gas in its vicinity. Such gas will typically be oxygen, but it may also be sulphur, iodine, chlorine, etc. This reaction will result in the formation of a compound, which may be termed, using literary license, an "oxide layer". Irrespective of its exact chemical makeup, this layer either is non-conductive or semi-conductive and, as a result, the electrical resistance of the contact will change from several milliohms to several hundred milliohms, or higher. Accordingly, gold is not a desirable surface material for a contact of the character described herein. An alternative surface material for such a contact which is commonly used is tin plating over nickel. However, such a contact is subject to fretting corrosion (i.e., corrosion due to stress which forms a film on a soft material such as tin), which raises the contact resistance. Accordingly, it is a primary object of this invention to provide an improved electrical contact member for use with a burn-in connector for integrated circuit chips which does not suffer from the aforenoted problems.

SUMMARY OF THE INVENTION

The foregoing, and additional, objects are attained in accordance with the principles of this invention by providing a contact member used to provide an electrical connection along a defined region of its edge with a lead having at least its contact surface formed of a relatively soft metal, the contact member comprising a laminate formed of at least one layer of a first material having good spring properties and at least one layer of a second material having the property that it does not form a solid solution with the soft metal. The layers of the first material are recessed with respect to the layers of the second material along at least the defined edge region.

The foregoing, and additional, objects of this invention are also attained by providing a method of manufacturing a contact member used to provide an electrical connection along a defined region of its edge with a lead having at least its contact surface formed of a relatively soft metal, comprising the steps of providing a contact member blank formed as a laminate of at least one layer of a first material and at least one layer of a second material, the first material having good spring properties and the second material having the property that it does not form a solid solution with the soft metal of the lead's contact surface, and recessing the layers of the first material with respect to the layers of the second material along at least the defined edge region.

BRIEF DESCRIPTION OF THE DRAWINGS

The foregoing will be more readily apparent upon reading the following description in conjunction with the drawings in which like elements in different figures thereof have the same reference numeral and wherein:

FIG. 1 is a cross-sectional view through an illustrative connector assembly in which an electrical contact member constructed in accordance with the principles of this invention may be utilized;

FIG. 2 is an enlarged view of an electrical contact member for use in the assembly shown in FIG. 1 and which is constructed according to the principles of this invention;

FIG. 3 is an enlarged cross-sectional view taken along the line 3—3 in FIG. 2;

FIG. 4 is an enlarged cross-sectional view of an alternate embodiment taken along the line 3—3 in FIG. 2; and FIG. 5 is an enlarged cross-sectional view of a further embodiment taken along the line 3—3 in FIG. 2.

DETAILED DESCRIPTION

Referring to the drawings, FIG. 1 shows a connector assembly, designated generally by the reference numeral 10, mounted on a printed circuit board 12 and in which a contact according to this invention may be utilized. The connector assembly 10 is of the type utilized for burn-in testing of an integrated circuit chip and includes, generally, a body portion 14, a hinged cover member 16, and a latch member 18 for releasably securing the cover member 16 to the body portion 14 in a closed position. The body portion 14 is formed with a plurality of cavities 20, each for holding a single electrical contact member, shown at 22. The cavities 20 are arranged around the periphery of a central pocket 24, sized so as to accept an integrated circuit chip package 26. Within the bottom of the pocket 24 there is disposed a spring member 28 which is utilized to spring load the package 26 so that upon opening of the cover member 16, the package 26 is partially ejected. The package 26 is formed with leads along its periphery, illustratively depicted at 30. As discussed above, the leads 30 are typically tin plated. It is the tin plating, combined with the multiple insertions/removals, that can result in an oxide layer build-up on the edge of the contact member 22.

FIG. 2 illustrates a contact member for use in the connector assembly 10. It should be understood that this invention is not limited to the particular contact member structure and shape shown in FIG. 2, which is depicted for illustrative purposes only. What is important is that the contact member 22 is generally planar and makes contact with the lead 30 of the integrated circuit chip package 26 along its edge in a defined region which may be considered to extend from the point labeled A in FIG. 2 to the point labeled B in FIG. 2.

As discussed above, certain materials are inappropriate for multiple insertion/removal rubbing contact with tin plated leads. It has been found that certain hard metals, such as for example, stainless steel or Watts type nickel, resist the deposition thereon of a layer of tin. Thus, these materials do not form a solid solution with the soft tin. However, these harder materials, by themselves, are not appropriate materials for making a contact member such as that shown in FIG. 2 because they do not exhibit inherent springiness, which is a requirement for the contact member 22. Accordingly, this invention contemplates forming a contact member from a composite material (i.e., a laminate) where at least one layer is of a material having good spring properties, such as, for example, beryllium copper or beryllium nickel, and at least one layer is a deposition-resisting material such as, for example, stainless steel.

FIG. 3 illustrates a first embodiment of this invention wherein the contact member 22 is formed as a laminate of a core member 32 of the material having good spring properties with cladding 34, 36 of the deposition-resisting material on opposite surfaces thereof. In accordance with this invention, and as shown in FIG. 3, the core member 32 is recessed from the cladding 34, 36 along at least the defined region between the points A and B. This leaves the exposed edges 38, 40 of the cladding material to act as an electrical contact, while the core 32 member provides the necessary spring property for the contact member. The tin transfer problem previously described with respect to gold is greatly diminished in the case of nickel or stainless steel as the cladding material, due to the fact that the metal transfer effect or cold welding to these materials is notoriously poor. Therefore, with any degree of wiping during the insertion/removal cycles, the effect of the tin transfer will be negligible. While the initial contact resistance of such a composite material will be higher than that of tin or gold, it will be a stable resistance and therefore much more acceptable for the burn-in process.

To manufacture the contact member shown in FIG. 3, initially there must be formed a laminate of cladding on a core member. As previously described, the core member should have good spring properties and may illustratively be beryllium copper or beryllium nickel. The cladding material should have the property that it does not form a solid solution with the soft metal of the integrated circuit chip leads. Stainless steel of the 300 or 400 series or Carpenter Alloy #20 ar appropriate cladding materials when the integrated circuit chip package leads are tin plated. Cladding of stainless steel on beryllium nickel or beryllium copper may be accomplished in a known manner by providing a sandwich of the materials where the abutting surfaces have been abraded and then rolling and annealing the sandwich until the desired thickness is attained. The thickness of the cladding may be as little as 0.001 inch and as high as 0.005 inch. In addition to the foregoing, one can also produce cladding by electroplating both surfaces of the core material with a Watts type nickel, which can be made in hardnesses up to Vickers 600. Thus, a planar sheet of composite material is formed, from which a contact member blank is then stamped.

To recess the core material from the cladding, the contact member blank is either immersed in or sprayed with an etching solution. The etching solution should have the property that it does not attack the cladding material, but only etches the core material. Illustrative etching solutions for use with stainless steel cladding on a beryllium nickel or beryllium copper core are ferric chloride, ammonium persulfate and chromic acid. The etching is allowed to proceed until the core metal recedes from the stamped edge surface for a distance of at least 0.0005 inch, and perhaps as much as 0.005 inch. According to this invention, it is only necessary that the core material be recessed along the defined region of the edge where contact is made (i.e., between the points A and B). How much of the edge is recessed is determined by how much of the contact member is immersed in or sprayed with the etching solution.

FIG. 4 illustrates an alternate embodiment for the contact member 22. In this embodiment, the core member 32 is only provided with the cladding 36 on one surface thereof. The materials and manufacturing steps to form the contact member shown in FIG. 4 are the same as those used to form the contact member shown in FIG. 3, with the exception that the cladding 34 is eliminated.

FIG. 5 illustrates a further embodiment of the contact member 22. In the embodiment shown in FIG. 5, the contact member blank is formed with a layer of the deposition-resisting material 42 sandwiched between two layers 44, 46 of the spring material. In the embodiment shown in FIG. 5, the formation of the contact member blank is limited in that electroplating of the layer 42 of deposition-resisting material on the spring material is not possible. Therefore, when manufacturing the embodiment shown in FIG. 5, the above-described process of rolling and annealing is preferred. The remainder of the manufacturing steps remain the same.

Accordingly, there have been described improved edge contact members and methods of manufacturing same. While illustrative embodiments of the present invention have been disclosed herein, it will be apparent to those of ordinary skill in the art that various modifications and adaptations to those embodiments are possible and it is only intended that the present invention be limited by the scope of the appended claims. Thus, the present invention contemplates a contact member formed as a laminate, where the number and order of the layers may be chosen to suit the particular application.

I claim:

1. A method of manufacturing a contact member used to provide an electrical connection along a defined region of its edge with a lead having at least its contact surface formed of a relatively soft metal, comprising the steps of:

providing a contact member blank formed as a laminate of at least one layer of a first material and at least one layer of a second material, said first material having good spring properties and said second material having the property that it does not form a solid solution with said soft metal; and recessing said at least one layer of said first material with respect to said at least one layer of said second material along at least said defined edge region.

2. The method according to claim 1 wherein the step of providing a contact member blank includes the steps of:

providing a planar sheet of said first material;
applying a layer of said second material to a surface of said planar sheet to form a laminate sheet; and forming from said laminate sheet a blank in the shape of the desired contact member.

3. The method according to claim 2 wherein the step of applying includes the further step of applying a layer of said second material to the opposite surface of said planar sheet.

4. The method according to claim 2 wherein the step of forming includes the step of stamping.

5. The method according to claim 1 wherein the step of recessing includes the step of chemical etching.

6. The method according to claim 1 wherein the step of providing a contact member blank includes the steps of:
  providing a laminate sheet of a layer of said second material between two layers of said first material; and
  forming from said laminate sheet a blank in the shape of the desired contact member.

* * * * *